(12) United States Patent
Peters et al.

(10) Patent No.: US 6,239,485 B1
(45) Date of Patent: May 29, 2001

(54) REDUCED CROSS-TALK NOISE HIGH DENSITY SIGNAL INTERPOSER WITH POWER AND GROUND WRAP

(75) Inventors: Michael G. Peters, Santa Clara; Wen-chou Vincent Wang, Cupertino; Yasuhito Takahashi, San Jose; William Chou, Cupertino; Michael G. Lee, San Jose; Solomon Beilin, San Carlos, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/315,785

(22) Filed: May 20, 1999

Related U.S. Application Data (63) Continuation-in-part of application No. 09/191,755, filed on Nov. 13, 1998, now Pat. No. 6,081,026.

(51) Int. Cl.[7] ................................ H01L 23/12; H01L 23/053
(52) U.S. Cl. ...................... 257/700; 257/691; 257/781; 257/698; 257/738; 257/778; 257/780; 257/774; 361/794; 361/795
(58) Field of Search ........................ 257/700, 691, 257/781, 698, 738, 778, 780, 774, 777, 734, 735, 736, 779; 361/794, 795

(56) References Cited

U.S. PATENT DOCUMENTS

| | | | |
|---|---|---|---|
| 4,202,007 | 5/1980 | Dougherty et al. | 357/80 |
| 4,271,588 | 6/1981 | Nowak | 29/827 |
| 4,547,834 | 10/1985 | Dumont et al. | 361/386 |
| 4,597,029 | 6/1986 | Kucharek et al. | 361/407 |
| 4,600,970 | 7/1986 | Bauer | 361/403 |
| 4,601,526 | 7/1986 | White et al. | 339/17 |
| 4,672,152 | 6/1987 | Shinohara et al. | 174/68.5 |
| 4,706,165 | 11/1987 | Takenaka et al. | 361/403 |
| 4,736,276 | 4/1988 | Ushifusa et al. | 361/414 |
| 4,821,142 | 4/1989 | Ushifusa et al. | 361/395 |

(List continued on next page.)

FOREIGN PATENT DOCUMENTS

| | | | |
|---|---|---|---|
| 0506225 A2 | 9/1992 | (EP) | H01L/23/538 |
| 0506225 A3 | 9/1992 | (EP) | H01L/23/538 |

OTHER PUBLICATIONS

Craig N. Ernsberger et al. FLEXCON ™ '96, "Colaminated Multilayer Flip Chip T–BGA Package Development" 29–43.

(List continued on next page.)

*Primary Examiner*—Minh Loan Tran
*Assistant Examiner*—Luan Thai
(74) *Attorney, Agent, or Firm*—Coudert Brothers (57) ABSTRACT

An interposer for providing power, ground, and signal connections between an integrated circuit chip or chips and a substrate. The inventive interposer includes a signal core and external power/ground connection wrap. The two sections may be fabricated and tested separately, then joined together using z-connection technology. The signal core is formed from a conductive power/ground plane positioned between two dielectric layers. A patterned metal layer is formed on each dielectric layer. The two metal layers are interconnected by a through via or post process. The conductive power/ground plane functions to reduce signal cross-talk between signal lines formed on the two patterned metal layers. The power/ground wrap includes an upper substrate positioned above the signal core and a lower substrate positioned below the signal core. The upper and lower substrates of the power/ground wrap are formed from a dielectric film having a patterned metal layer on both sides, with the patterned layers connected by a through via or post process. The two power/ground wrap substrates may be formed separately or from one substrate which is bent into a desired form (e.g., a "U" shape). The two power/ground substrates are maintained in their proper alignment relative to the signal core and to each other by edge connectors which are also connected to the signal core's intermediary power/ground plane.

6 Claims, 5 Drawing Sheets

U.S. PATENT DOCUMENTS

| | | | |
|---|---|---|---|
| 4,854,038 | 8/1989 | Wiley ................................... | 29/830 |
| 4,884,170 | 11/1989 | Ohki et al. .......................... | 361/414 |
| 4,922,377 | 5/1990 | Matsumoto et al. ................. | 361/387 |
| 4,926,241 | 5/1990 | Carey ................................... | 357/75 |
| 4,931,134 | 6/1990 | Hatvervitz ........................... | 156/630 |
| 4,984,132 | 1/1991 | Sakurai et al. ...................... | 156/630 |
| 5,012,047 | 4/1991 | Dohya ................................. | 174/250 |
| 5,036,431 | 7/1991 | Adachi et al. ....................... | 56/412 |
| 5,097,393 | 3/1992 | Nelson et al. ....................... | 361/386 |
| 5,142,448 | 8/1992 | Kober et al. ........................ | 361/398 |
| 5,159,530 | 10/1992 | Komoto ............................... | 361/386 |
| 5,264,729 | 11/1993 | Rostoker et al. .................... | 257/774 |
| 5,281,151 | 1/1994 | Arima et al. ........................ | 439/68 |
| 5,325,268 | 6/1994 | Nachnani et al. ................... | 361/767 |
| 5,331,514 | 7/1994 | Kuroda ................................ | 361/760 |
| 5,354,955 | 10/1994 | Gregor et al. ....................... | 174/250 |
| 5,362,656 | 11/1994 | McMahon ............................ | 437/21 |
| 5,367,435 | 11/1994 | Andros et al. ....................... | 361/749 |
| 5,375,042 | 12/1994 | Arima et al. ........................ | 361/784 |
| 5,386,341 | 1/1995 | Olson et al. ......................... | 361/749 |
| 5,394,303 | 2/1995 | Yamaji ................................. | 361/749 |
| 5,396,034 | 3/1995 | Fujita et al. ......................... | 174/261 |
| 5,418,689 | 5/1995 | Alpaugh et al. ..................... | 361/792 |
| 5,419,038 | 5/1995 | Wang et al. ......................... | 29/830 |
| 5,426,563 | 6/1995 | Moresco et al. .................... | 361/689 |
| 5,428,190 | 6/1995 | Stopperan ............................ | 174/261 |
| 5,435,733 | 7/1995 | Chernicky et al. .................. | 439/68 |
| 5,448,020 | 9/1995 | Pendse ................................. | 174/250 |
| 5,450,290 | 9/1995 | Boyko et al. ........................ | 361/792 |
| 5,477,933 | 12/1995 | Nguyen ............................... | 74/262 |
| 5,479,110 | 12/1995 | Crane et al. ......................... | 324/757 |
| 5,491,612 | 2/1996 | Nicewarner, Jr. .................... | 361/760 |
| 5,530,288 | 6/1996 | Stone ................................... | 257/700 |
| 5,534,666 | 7/1996 | Ishida .................................. | 174/260 |
| 5,544,017 | 8/1996 | Beilin et al. ......................... | 361/790 |
| 5,708,568 | 1/1998 | Ostendorf ............................ | 361/749 |
| 5,719,749 | 2/1998 | Stopperan ........................... | 361/769 |
| 5,789,815 | 8/1998 | Tessier et al. ....................... | 257/723 |
| 5,854,534 * | 12/1998 | Beilin et al. ......................... | 257/691 |

OTHER PUBLICATIONS

Sarah E. Leach et al. 1997 International Symposium on Advanced Packaging Materials, "Colamination Technology for electronic Packaging Applications" 38–41.

Catherine Gallagher et al. 1997 International Symposium on Advanced Packaging Materials, "Vertical Interconnect in Multilayer Applications Using Ormet® Conductive Composites" 35–37.

Ernsberger Proceedings of the First International Conference on Flex Circuits, Oct. 10–14, 1994, High Density Multilayer Interconnect Based on Adhesiveless Flex Circuits.

* cited by examiner

REDUCED CROSS-TALK NOISE HIGH DENSITY SIGNAL INTERPOSER WITH POWER AND GROUND WRAP

RELATED APPLICATION

This is a continuation-in-part application of U.S. patent application Ser. No. 09/191,755, U.S. Pat. No. 6,081,026 entitled "NOISE HIGH DENSITY SIGNAL INTERPOSER WITH POWER AND GROUND WRAP," filed Nov. 13, 1998, assigned to the assignee of the present application and the contents of which is hereby incorporated by reference.

BACKGROUND OF THE INVENTION

1. Field of the Invention

The present invention relates to integrated circuit device packaging, and more specifically, to an interposer substrate capable of reducing cross-talk between signal lines which is suitable for interconnecting integrated circuit chips to a printed circuit board or other substrate.

2. Description of the Prior Art

An interposer is a structure used in the manufacture of single and multi-chip modules (SCMs or MCMs) to electrically connect one or more integrated circuit chips (ICs) to a printed circuit board or other substrate. The interposer provides power and ground connections between the board or substrate and the ICs. The interposer also provides signal paths between the IC chips and the board or substrate, and if desired, between different chips mounted on the interposer. An interposer thus provides a means of interconnecting signal, power, and ground lines between a substrate, an integrated circuit chip or chips, and ultimately a package containing the chip(s).

As the number of components in electronic devices increases and the size of the individual components decreases, there is an increase in the number and density of power, ground, and signal interconnections needed between individual ICs and the substrate to which the chips are connected. This means that the density of the interconnections which need to be included as part of an interposer also increases. However, problems arise in placing signal lines in close proximity to each other and to power supply lines when fabricating such an interposer. These problems include interference and cross-talk arising from coupling between the lines on a common layer or between signal lines on different signal layers, and capacitive coupling between the lines and the substrate which produces noise in the signals. In conjunction with the separation between the various lines, the dielectric constant of the substrate material thus plays an important role in reducing (or creating) these type of problems.

Another disadvantage of conventional approaches to packaging IC chips in MCMs arises from the method used to deliver power to the chips. This problem results because power lines are typically routed through the same substrate which is utilized to carry signals to and from the chip. The power feedthroughs will compete for space with the signal I/O lines. This will further increase the problems caused by densely packed signal traces. Another important disadvantage is that the thinness of the substrates used in traditional multichip modules results in the power feeds to the IC chips having a relatively high impedance. This results in undesired noise, power loss, and excess thermal energy production. These problems are relevant to the routing of both power and signal lines though an interposer substrate.

What is desired is an interposer for interconnecting a single integrated circuit chip to a substrate, or for interconnecting a plurality of chips to each other and to a substrate, which addresses the noted disadvantages of conventional structures.

SUMMARY OF THE INVENTION

The present invention is directed to an interposer for providing power, ground, and signal connections between an integrated circuit chip or chips and a substrate. The inventive interposer includes a signal core and external power/ground connection wrap. The two sections may be fabricated and tested separately, then joined together using z-connection technology. The signal core is formed from a conductive power/ground plane positioned between two dielectric layers. A patterned metal layer is formed on each dielectric layer. The two metal layers are interconnected by a through via or post process. The conductive power/ground plane functions to reduce signal cross-talk between signal lines formed on the two patterned metal layers.

The power/ground wrap includes an upper substrate positioned above the signal core and a lower substrate positioned below the signal core. The upper and lower substrates of the power/ground wrap are formed from a dielectric film having a patterned metal layer on both sides, with the patterned layers connected by a through via or post process. The two power/ground wrap substrates may be formed separately or from one substrate which is bent into a desired form (e.g., a "U" shape). The two power/ground substrates are maintained in their proper alignment relative to the signal core and to each other by edge connectors which are also connected to the signal core's intermediary power/ground plane.

The top layer of the upper power/ground wrap substrate and the bottom layer of the lower power/ground wrap substrate serve as the ground layer. The ground layer includes isolated pads for signal and power interconnections between the base substrate on which the interposer is mounted and the chip(s) mounted on top of the interposer. The bottom layer of the upper substrate and the top layer of the lower substrate of the power/ground wrap serve as the power layer and include isolated pads for signal interconnections. With an integrated circuit chip or chips connected to the upper layer of the top substrate of the power/ground wrap and a printed circuit board or other mounting substrate connected to the bottom layer of the lower substrate of the wrap, the inventive interposer provides a set of high density and electrically isolated signal, power, and ground interconnections having reduced cross-talk between signal lines.

DETAILED DESCRIPTION OF THE INVENTION

The present invention is directed to an interposer designed to provide signal, power, and ground connections between an integrated circuit chip and an underlying printed circuit board or substrate. The inventive interposer provides several advantages over conventional structures:

(1) The density of the interposer signal routing lines can be higher than for conventional interposers because there are no power and ground line connects which pass through the signal core. In this regard, the gap between vias which connect signal lines is increased by approximately a factor of the square root of 2 compared to the line density on a chip. This means that the signal line density on the interposer can be increased relative to that on a chip which includes power and ground lines:

(2) Different technology and processes can be used to fabricate the signal core and the power/ground wrap. Since the pattern size of the power/ground wrap is larger, a lower cost process (e.g., subtractive) can be used:

(3) The signal core and power/ground wrap can be fabricated and tested separately. This is advantageous because the cycle time and yield of parallel processes will be better than for sequential processes:

(4) The power/ground plane positioned between the signal layers on either side of the signal core acts to reduce the cross-talk between signal lines on the two layers;

(5) The majority of the power/ground vias can be replaced by an edge connection. If a laser is used to drill the vias, the need for fewer vias will reduce the cost of this aspect of the fabrication: and (6) If a decoupling capacitor or termination resistor is needed, it (they) can be connected externally through the edge connector of the power/ground layers in one direction and the edges of the signal layers in another direction. This will provide a three-dimensional package.

As the inventors have realized, not all of the connections (power, ground, signal resistor, capacitor, etc.) required to connect an IC chip to a substrate need to pass through an intermediary interposer or be distributed on the same substrate. As a result, the signal traces can be increased in density and the fabrication costs can be reduced by using the inventive structure.

Figure 1:
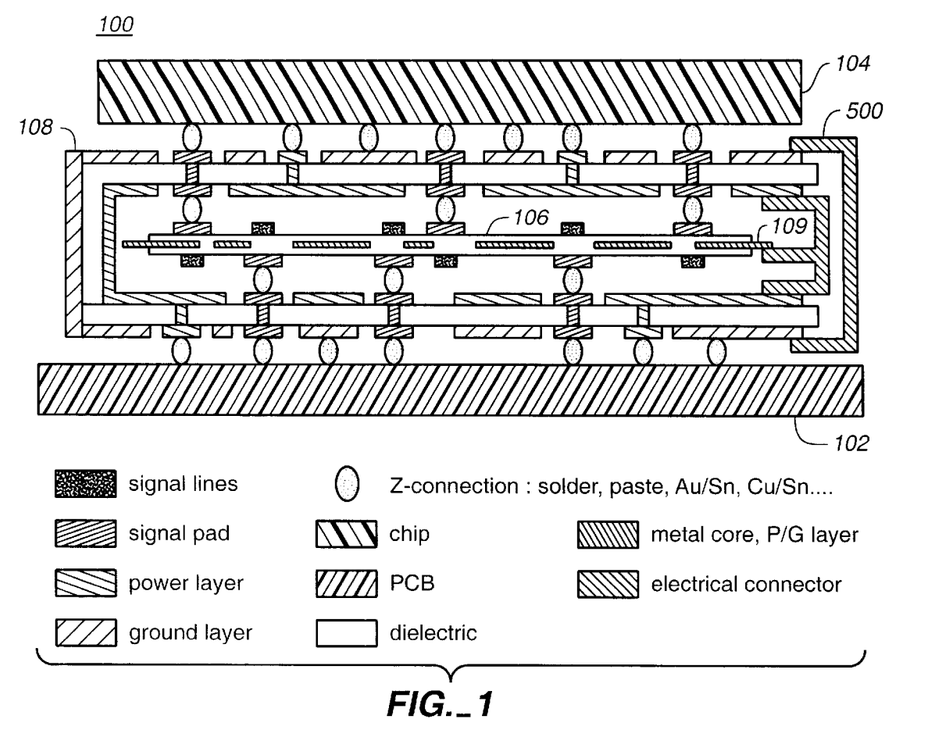
FIG. 1 is a schematic cross-sectional view of the reduced cross-talk signal interposer of the present invention, and is shown positioned between a printed circuit board and an integrated circuit chip.

FIG. 1 is a schematic cross-sectional view of the reduced cross-talk signal interposer 100 of the present invention, and is shown positioned between a printed circuit board 102 and an integrated circuit chip 104. The legend for the figure identifies some of the components of the complete structure. As shown in the figure, interposer 100 includes two primary sections; a signal core 106 and a power/ground wrap 108. The two sections can be fabricated and tested separately and then joined together using a z-connection technology, e.g., solder bumps, anisotropic conducting polymers, or another suitable method. This reduces the cycle time for manufacturing and testing of the structure, and increase the types of processing techniques which may be used to form the different parts of the final structure.

As shown in the figure, in accordance with the present invention, power and ground interconnections are routed between the mounting substrate 102 and the chip(s) 104 without passing through the signal core 106. On the other hand, the signal lines are routed between the mounting substrate 102 and the chip(s) 104 by passing only through the signal core. This architecture provides electrical isolation between the power, ground, and signal interconnections (and hence reduces noise and other problems caused by capacitive coupling between lines) while increasing the density of signal lines which can be connected between the substrate and chip(s). Signal core 106 includes a power/ground layer 109 positioned between signal layers which are on either side of that substrate and together form the basis for the signal core. Power/ground layer 109 acts to reduce cross-talk between signal lines on the same or different signal layers of signal core 106.

As shown in the figure, edge connectors 500 may be used to electrically connect different ground layers (e.g., the lower surface of the lower power/ground substrate to the upper surface of the upper power/ground substrate), different power layers (e.g., the upper surface of the lower power/ground substrate to the lower surface of the upper power/ground substrate), or the power/ground layer of the signal core to other ground or power layers of the interposer. Although a single set of edge connectors 500 is shown in the figure, note that if the upper and lower power/ground substrates are fabricated separately (rather than formed from a flexible substrate which is bent into a "U" shape), then a set of connectors 500 may be used at both ends of the two power/ground substrates.

Figure 2:
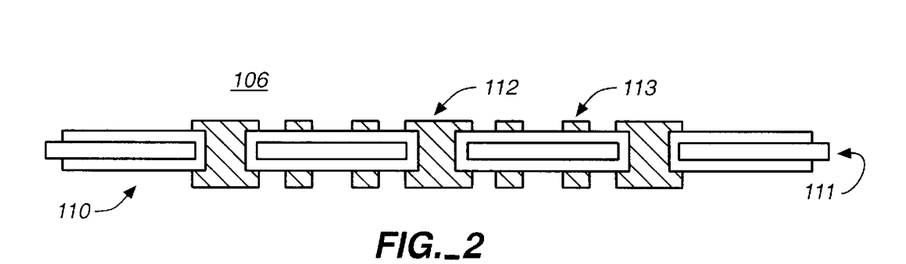
FIG. 2 is a schematic cross-sectional view of the signal core which is part of the interposer of the present invention.
Figure 3A:
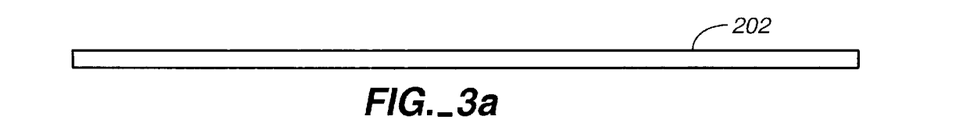
FIGS. 3(a) to (g) show a process flow for a first method of fabricating the signal core which is part of the interposer of the present invention.
Figure 3B:
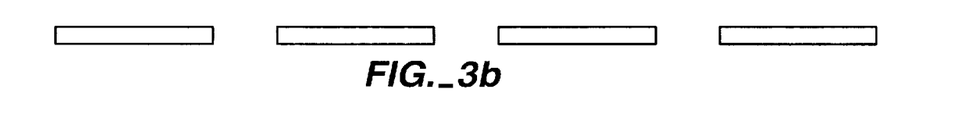
Figure 3C:
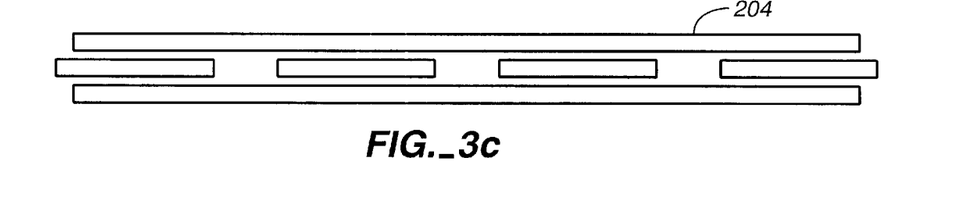
Figure 3D:
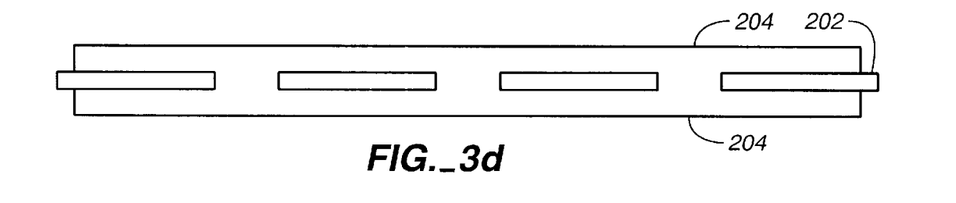
Figure 3E:
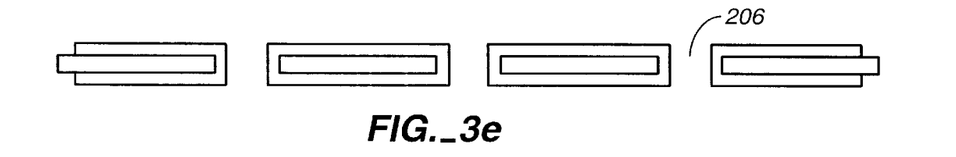
Figure 3F:
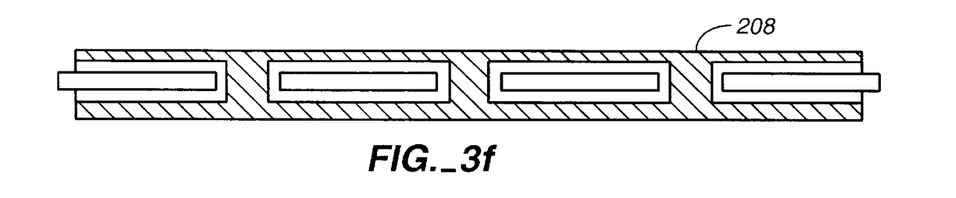
Figure 3G:
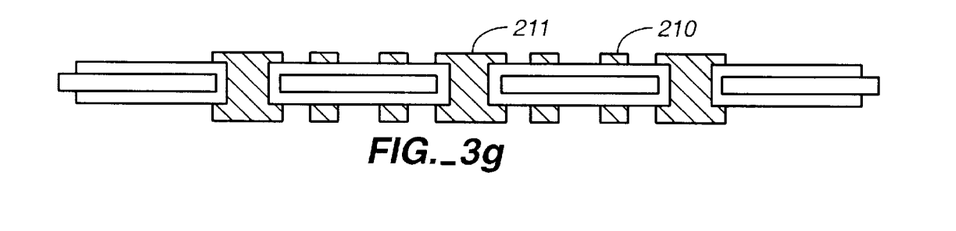

FIG. 2 is a schematic cross-sectional view of signal core 106 which is part of the interposer of the present invention. Signal core 106 is formed from a conductive core or substrate 111 through which holes or apertures are formed. Conductive core 111 is typically formed from a suitable metal and serves as both a power/ground layer for the interposer and as a reinforcing structure for the signal layers of signal core 106. A dielectric film 110 (e.g., Polyimide, BT, etc.) is arranged on both sides of conductive core 111. Signal lines 113 are defined on a patterned metal layer formed on each of the two dielectric film layers. The two patterned metal layers are interconnected as desired by either a through via or a conductive post structure 112, with the through via or conductive post being suitable for interconnecting the signal core to other layers of the interposer structure, or to the mounting substrate or integrated circuit chips.

Each dielectric layer 110 is typically 25 to 50 microns thick. As noted, the patterned metal layers include signal lines 113 and vias/signal pads 112. Signal lines 113 are typically 20 microns wide with a pitch of 20 microns. The size/pitch can be reduced further if desired, e.g., to a width of 5 microns and pitch of 7.5 microns. Signal pads 112 are used to interconnect signals between layers of the overall mounting substrate-interposer-chip structure. Signal pads 112 are typically 100 microns wide with a pitch of 350 microns.

FIGS. 3(a) to (g) show a process flow for a first method of fabricating the signal core which is part of the reduced cross-talk interposer of the present invention. In the process flow shown in FIG. 3, the metal layers on the two sides of the core substrate are interconnected by a through via. As shown in the figures, the process flow begins with a conductive layer, which may be formed from a suitable metal 202 (FIG. 3(a)). Holes or apertures are formed in layer 202 at the positions where through vias or conductive posts will later be formed (FIG. 3(b)). A dielectric layer 204 is then formed on each surface of conductive layer 202. Dielectric layers 204 may be laminated onto each surface of layer 202 (FIGS. 3(c) and 3(d)). Vias 206 are formed through dielectric layers 204 in the locations corresponding to the predefined apertures in conductive layer 202 (FIG. 3(e)). Vias 206 may be formed by means of a laser drill or plasma etch process. Vias 206 are then metallized and a seed layer 208 is deposited on the surface of each dielectric layer 204 using electroless plating, direct plating, sputtering, or another suitable process (FIG. 3(f)). Seed layer 208 is then built up to form a metal layer of desired thickness which is patterned as desired to form signal lines 210 and signal pads 211 (FIG. 3(g)). The metal signal line layer may be patterned using either an additive process (e.g., electrolytic plating) or a subtractive process.

Note that an additive process may be preferable for some of the steps to achieve metal patterning of 5–10 microns width and a pitch of 5–10 microns. If the line width or pitch can be larger, a subtractive process may be used.

FIGS. 4(a) to (g) show a process flow for a second method of fabricating the signal core which is part of the reduced cross-talk interposer of the present invention. In the process flow shown in FIG. 4, a conductive layer 202 again has holes or apertures formed through it at desired locations (FIGS. 4(a) and 4(b)). A dielectric layer 204 is formed (e.g., laminated) onto one surface of conductive layer 202. A dielectric having a previously formed metallized surface or layer 205 is then laminated onto the other surface of conductive layer 202 (FIGS. 4(c) and 4(d)). Vias 206 are formed through dielectric layers 204 in the locations corresponding to the predefined apertures in conductive layer 202 (FIG. 4(e)). Vias 206 may be formed by means of a laser drill or plasma etch process. Metallized layer 207 of the combined dielectric and metal layer structure 205 is used to provide an electrical connection for plating of vias 206 and formation of a conductive layer 209 on dielectric layer 204 (FIG. 4(f)). A method for performing this step is described in U.S. patent application Ser. No. 09/275,543, entitled "Method of Fabrication of Substrate with Via Connection", filed Mar. 24, 1999, assigned to the assignee of the present invention and the contents of which is hereby incorporated by reference.

Figure 4A:
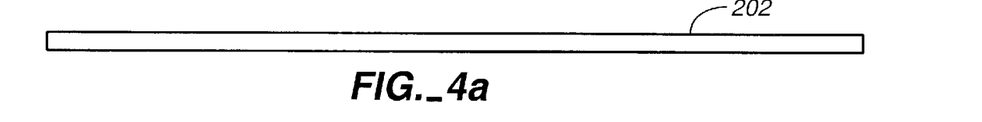
FIGS. 4(a) to (g) show a process flow for a second method of fabricating the signal core which is part of the interposer of the present invention.
Figure 4B:
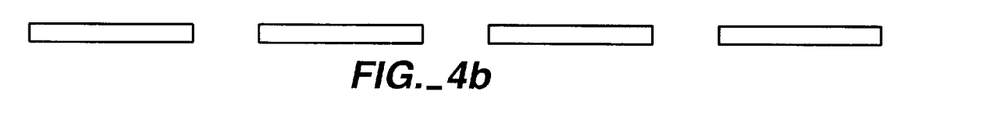
Figure 4C:
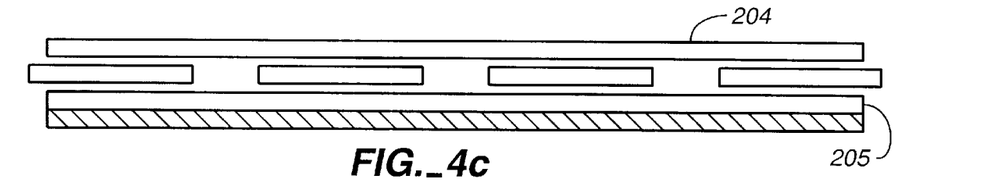
Figure 4D:
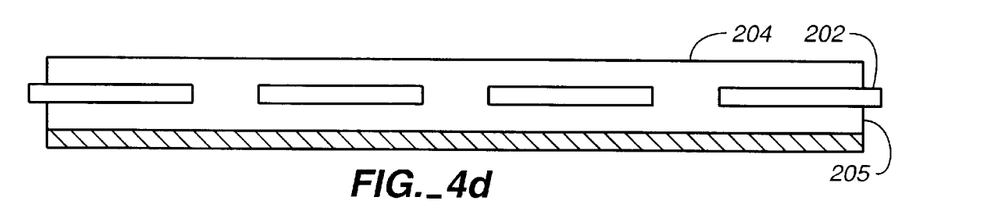
Figure 4E:
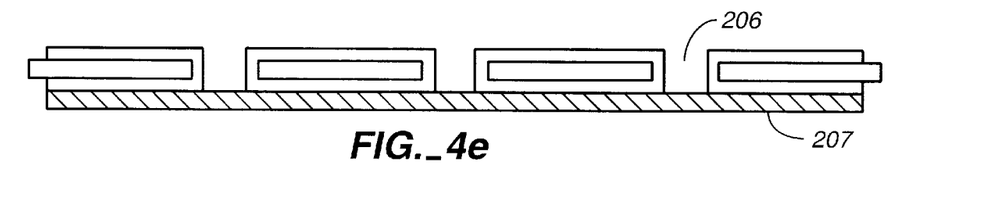
Figure 4F:
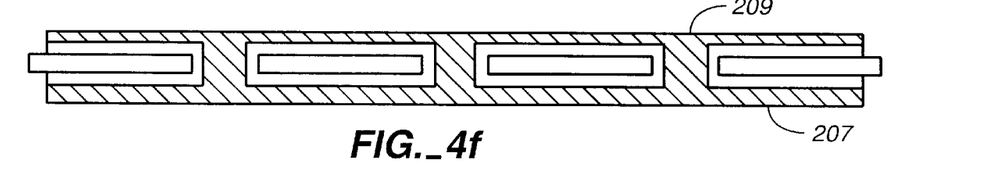
Figure 4G:
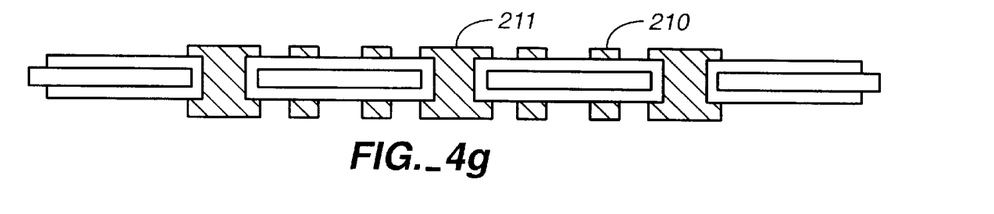

Conductive layers 207 and 209 are then patterned as desired to form signal lines 210 and signal pads 211 (FIG. 4(g)). The seed layers may be patterned using either an additive process (e.g., electrolytic plating) or a subtractive process.

Note that an additive process may be preferable for some of the steps to achieve metal patterning of 5–10 microns width and a pitch of 5–10 microns. If the line width or pitch can be larger, a subtractive process may be used.

Figure 5A:
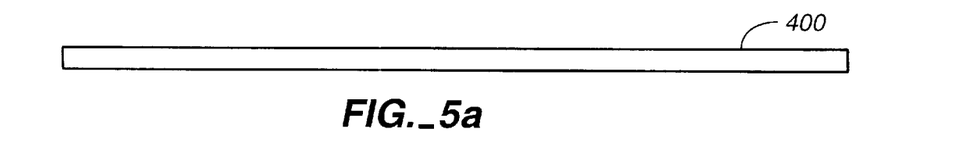
FIGS. 5(a) to (e) show a process flow for a method of fabricating the power/ground wrap which is part of the interposer of the present invention.
Figure 5B:
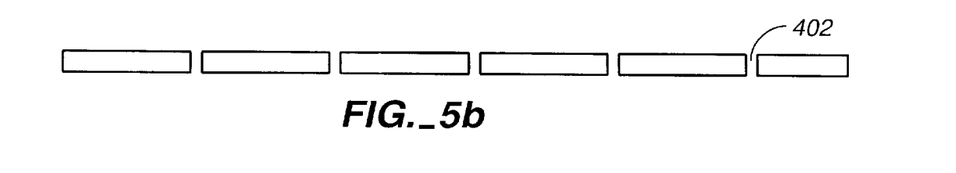

FIGS. 5(a) to (e) show a process flow for a method of fabricating the power/ground wrap 108 which is part of the reduced cross-talk interposer of the present invention. The fabrication process shown begins with a dielectric substrate 400 (e.g., a dielectric film such as polyimide, as shown in FIG. 5(a)). Through vias 402 are formed in the substrate at the desired locations FIG. 5(b)). The vias may be formed by a laser drill, plasma etching, or another suitable method. The vias are then filled with a conductive material, and a conductive layer 404 is formed on the upper and lower surfaces of the substrate (FIG. 5(c)). The upper/outer conductive surface 430 of the power/ground wrap will be patterned to form the ground layer of the power/ground wrap, with electrically isolated pads for signal and power interconnections between the IC chip, interposer, and substrate. The lower/inner conductive surface 432 of the power/ground wrap will be patterned to form the power layer of the power/ground wrap, with electrically isolated pads for signal interconnections between the IC chip, interposer, and substrate.

Figure 5C:
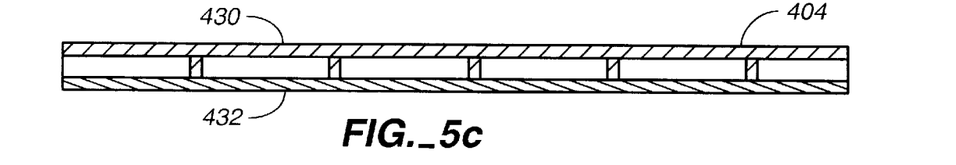

Dielectric layer 400 is typically 25 to 50 microns thick. Ground layer 430 provides a continuous ground plane formed from a 5 to 20 micron thick layer of copper, for example. Ground layer 430 includes isolation rings to permit power and signal lines to be fed through the layer. The signal 440 and power 442 pads formed on ground layer 430 are typically 100 microns wide with a pitch of 250 microns. Note that the size or pitch may be altered if desired since a ground connection via is not needed.

Power layer 432 provides a continuous plane formed from a 5 to 20 micron thick layer of copper, for example and includes isolation rings to permit signal lines to be fed through the layer. The signal pads 444 formed on power layer 432 are typically 100 microns wide with a pitch of 350 microns.

The conductive material used to fill the vias and form the conductive layers may be applied by an electroless and/or electrolytic plating process. Metal chemical vapor deposition (MCVD) or another suitable process may also be used.

Figure 5D:
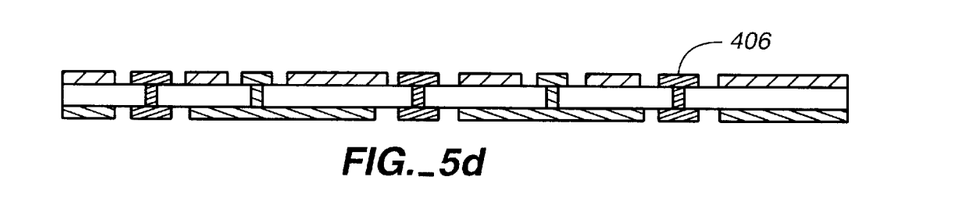

After formation, the conductive layers on the upper and lower surfaces of the substrate are patterned to form the desired power, ground, and signal connections 406 (FIG. 5(d)). A subtractive process may be used to form the patterned layers. Since substrate 400 is a thin-film, it may be bent to form the "U" shaped structure of FIG. 5(e) (or another desired shape) from that of FIG. 5(d). As noted, the top surface 430 of power/ground wrap 108 forms the ground layer and includes isolated pads for signal 440 and power 442 interconnections. The bottom surface 432 of power/ground wrap 108 forms the power layer and includes isolated pads for signal interconnections 444.

Figure 5E:
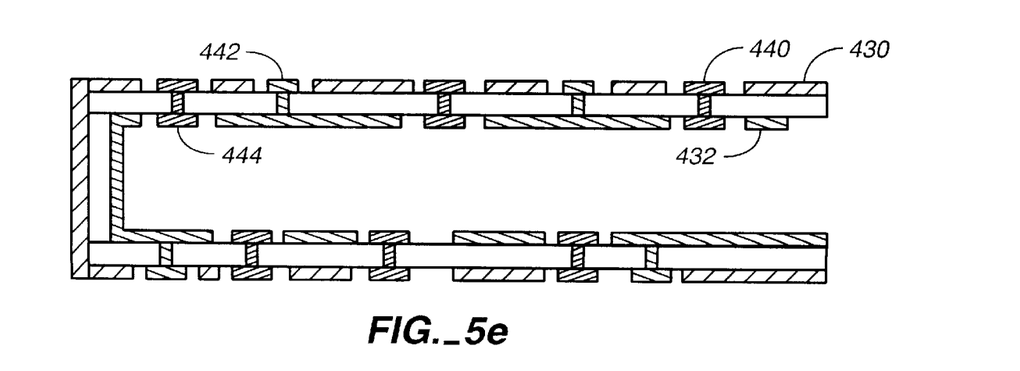

With the signal core of FIG. 2 inserted between the upper and lower substrates of the power/ground wrap, signal connections may be made between the base substrate (element 102 of FIG. 1), the signal core, and the integrated circuit chip(s) in isolation from the power and ground connections between the base substrate and the chip(s). This permits an increase in signal line density and minimization of signal path lengths, while achieving a high degree of electrical isolation between the different types of lines. Note that in the design for power/ground wrap 108 shown in the figure, the ground connections are arranged on the outside surfaces of the wrap, while the power connections are on the inside surfaces. This acts to isolate the power and ground connections from each other, as well as from the signal connections which pass through the signal core.

Figure 6:
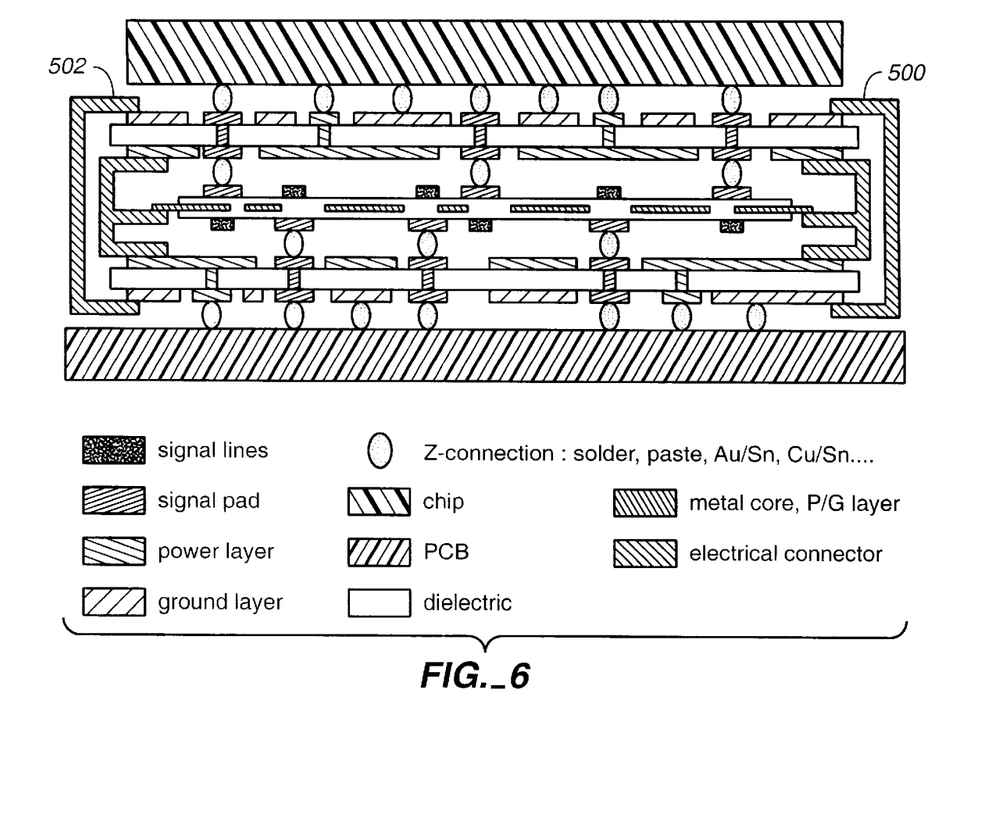
FIG. 6 is a schematic cross-sectional view of a different construction of the reduced cross-talk signal interposer of the present invention, and is shown positioned between a printed circuit board and an integrated circuit chip.

FIG. 6 is a schematic cross-sectional view of a different construction of the reduced cross-talk signal interposer of the present invention, and is shown positioned between a printed circuit board and an integrated circuit chip. In this situation, the need for precise alignment between the top, bottom, and sides of the wrap and the signal core (which is present in the method described previously with respect to FIG. 5) is lessened. Instead, the top and bottom substrates of the ground/power layers may be fabricated as separate substrates (instead of being formed by bending a single flexible substrate) and assembled to the signal core separately. Edge connectors 500, 502 are used to interconnect the power/ground layers between the two power/ground substrates and the power/ground layer of the signal core as needed. Note that for the "wrapped" structure shown in FIG. 1, a single set of edge connectors 500 (on one end of the substrates) is used to provide the desired interconnections between the power/ground layers and the power/ground layer of the signal core.

When fabricating the inventive reduced cross-talk signal interposer structure, the upper power/ground substrate or surface, signal core, and lower power/ground substrate or surface are interconnected as required using a suitable z-connection technology, followed by attachment of the edge connector or connectors to interconnect the power/ground substrates.

A preferred z-connection technology suited for use in constructing the present invention is described in U.S. patent application Ser. No. 09/192,003, filed Nov. 13$^{th}$, 1998, entitled "Multilayer Laminated Substrates With High Density Interconnects and Methods of Making the Same", assigned to the assignee of the present invention, and the contents of which is incorporated by reference.

The integrated circuit chip(s) can be attached to the inventive interposer by flip chip, TAB (tape automated bonding), flip TAB, wire bonding, or another suitable method. For most applications, the preferred interconnection method is a flip chip area array process. The interposer can be connected to the PCB or other substrate by means of a ball grid array (BGA).

The inventive interposer structure provides several important advantages compared to conventional interposers. Firstly, since there are no power and ground line interconnects passing through the signal core, the signal routing density can be higher than for conventional interposers. This occurs because the separation between vias in which signal lines can be formed in the inventive structure is increased by a factor of approximately the square root of 2 relative to the separation between signal, power, or ground lines on a chip. For example, the separation between signal vias on the interposer becomes approximately 350 microns for applications with a 250 micron via pitch on the chip. This means that the signal line routing density can be increased on the interposer relative to its value for the chip, without introducing significant cross-talk, etc. (i.e., a signal line pitch of 250 microns on the interposer corresponds to a smaller, impractical pitch on the chip if all of the signal, power, and ground lines were fabricated on the chip).

This benefit of the present invention can be understood by reference to the following diagrams. With S: signal, V: power, and G: ground, the lines on the chip can be represented as:

| S | V | S | V | S | V |
|---|---|---|---|---|---|
| G | S | G | S | G | S |
| S | V | S | V | S | V |
| \| 250 μm \| | | | | | |

The separation between lines (pitch) is shown as 250 microns, a typical value.

However, with the inventive interposer structure, the signal core lines can be represented as:

| S |   | S |   | S |         |
|---|---|---|---|---|---------|
|   | S |   | S |   | S       |
| S |   | S |   | S | 350 μm  |

The separation between signal lines is now approximately 350 microns. Thus, assuming a limitation that the lines must be separated by 250 microns, the density of signal lines though the signal core can be increased relative to that of the signal lines on the chip. Since the signal lines pass through the power/ground layers, the lines are shorter than if they were required to pass around the power and ground lines. This reduces signal delays and propagation losses.

Another benefit of the present invention is that because the signal core and power/ground wrap are fabricated in parallel instead of as part of a sequential process flow, the two structures can be fabricated and tested separately. This reduces the cycle time and improves the yield for the overall process. It also permits different technologies and processes to be used for the two structures, permitting optimization of the process flow for each structure (and the associated reduction in processing cost). In addition, since the majority of the power and ground vias typically used can be replaced by edge connectors, the number of vias formed is reduced, reducing the fabrication cost.

Although the present invention has been described with reference to exemplary materials and processes, it may also be practiced using other embodiments and variations of the inventive concept. For example, the signal core as well as the power/ground layers can be fabricated from flexible films or printed circuit boards (for low cost, low performance systems). If a printed circuit board is used for the signal core, then due to the low wiring density, more than one signal core can be laminated to a support substrate, or to another signal core.

If a decoupling capacitor is required, then a thin film capacitor can be connected to the power/ground layers externally by connection to the edge connector in one (x) direction. If a termination resistor is required, then a thin film resistor can be connected to the edge of the signal layers externally in another (y) direction.

The inventive structure also exhibits reduced cross-talk between signal lines in the different layers of the signal core because of the presence of the power/ground layer in the signal core. This permits greater flexibility in the signal line routing because of a lessened concern for cross-talk noise (e.g., mixed signal layers (both X and Y) can be routed in each signal core layer). This can be a substantial advantage for high performance applications.

In addition to reducing signal line cross-talk, the power/ground layer of the signal core also supplies increased rigidity to the flexible signal core substrate, increasing its positional stability. This results in reduced uncertainty in the location of the signal vias passing through the signal core, allowing the use of smaller signal pads. This further increase the space in which signal lines can be routed for a given via pitch.

Although the described embodiment of the power/ground wrap has two layers, the total number of power/ground layers can be greater. Each of the layers can be connected through the edge connector(s). Note that a flexible edge insert can be built within the power/ground layers. The flexible edge insert can be inserted into the edge connector for the purpose of accommodating problems arising from the non-planarity of the edge connector.

The signal core can be fabricated using a buildup process if the higher signal line density justifies the increased fabrication cost. The signal core and/or power/ground layers can be formed from flexible films or printed circuit boards (PCB, for lower cost and lower performance systems). If a PCB is used for the signal core, then multiple such cores may be laminated together. Thin film capacitors (TFC) may be used as decoupling capacitors. Thin film resistors (TFR) may be used as termination resistors. Additional signal layers can be formed into the structure, with the additional layers being electrically separated from each other (and the other layers) by a power/ground plane.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. An interposer for connecting an integrated circuit chip to a mounting substrate, comprising:

a power and ground connection routing structure having a first substrate to which the integrated circuit chip may be interconnected and a second substrate to which the mounting substrate may be interconnected, the first and second substrates including a plurality of conductive vias formed therein for power and ground connection paths between the mounting substrate and a mounted integrated circuit chip; and a signal line routing structure disposed between the first and second substrates of the power and ground connection routing structure, the signal line routing structure including a conductive substrate on a first and second sides of which is disposed a dielectric layer, with a patterned metal layer disposed on each dielectric layer, and including a plurality of conductive vias formed between the patterned metal layers for signal paths between the first and second substrates of the power and ground connection routing structure, wherein the power and ground connection paths are substantially isolated from the signal paths so that power is routed through the power and ground connection routing structure without passing through the signal line routing structure.

2. The interposer of claim 1, wherein the power and ground connection routing structure further comprises:

a patterned conductive layer arranged on a first and a second coplanar face of the first substrate, the conductive vias providing electrical connections between the conductive layers on the first and second faces of the first substrate; and a patterned conductive layer arranged on a first and a second coplanar face of the second substrate, the conductive vias providing electrical connections between the conductive layers on the first and second faces of the second substrate.

3. The interposer of claim 1, further comprising:

a support member to maintain the first and second substrates of the power and ground connection routing structure at a desired separation.

4. The interposer of claim 3, wherein the support member electrically connects the conductive substrate of the signal line routing structure to the power connection paths of the power and ground connection structure.

5. The interposer of claim 2, wherein the power and ground connection routing structure further comprises:

a ground connection path between the first coplanar face of the first substrate and the second coplanar face of the second substrate.

6. The interposer of claim 2, wherein the power and ground connection routing structure further comprises:

a power connection path between the second coplanar face of the first substrate and the first coplanar face of the second substrate.

* * * * *